United States Patent [19]

Knoll

[11] 3,916,226

[45] Oct. 28, 1975

[54] METHOD AND CIRCUITRY TO CONTROL THE DEFLECTION OF A PIEZOELECTRIC ELEMENT

[75] Inventor: Dieter Bertram Knoll, Palo Alto, Calif.

[73] Assignee: Hewlett-Packard GmbH, Boblingen, Germany

[22] Filed: Mar. 4, 1974

[21] Appl. No.: 448,144

[30] Foreign Application Priority Data

Mar. 16, 1973 Germany ............................ 2313107

[52] U.S. Cl. ........................ 310/8; 310/8.1; 310/8.5; 310/8.6

[51] Int. Cl.² ............................................ H01L 41/08

[58] Field of Search ............... 310/8.5, 8.6, 8.2, 9.8, 310/8.1, 8, 8.3

[56] References Cited

UNITED STATES PATENTS

| | | | |
|---|---|---|---|
| 2,594,841 | 4/1952 | Arndt, Jr. | 310/8.6 X |
| 3,156,759 | 11/1964 | Collen | 310/8.1 UX |
| 3,278,770 | 10/1966 | Shoh | 310/8.1 |
| 3,356,848 | 12/1967 | Heyck | 310/8.1 X |
| 3,443,130 | 5/1969 | Shoh | 310/8.1 |
| 3,489,930 | 1/1970 | Shoh | 310/8.1 |
| 3,526,792 | 9/1970 | Shoh | 310/8.1 |
| 3,555,453 | 1/1971 | Littauer | 310/8.1 X |
| 3,646,413 | 2/1972 | Oomen | 310/8.6 X |

*Primary Examiner*—Mark O. Budd
*Attorney, Agent, or Firm*—Patrick J. Barrett

[57] ABSTRACT

A piezoelectric tuning element for precisely controlling the distance between two components has a pair of electrodes each located at opposing sides thereof and is supplied with a constant current over a predetermined first time interval establishing a charge of one polarity which is then completely withdrawn during a second time interval. Thereby a linearly increasing deflection from a predetermined initial value to a second precisely predetermined deflection value is caused during the first time interval, and a return to the initial value is achieved precisely, without appreciable hysteresis at the end of the second time interval.

The initial level and polarity of the current at the beginning of the second time interval and the final level of the current and its polarity at the end of the second time interval are equal and correspond to the constant level of the current during the first time interval. Thereby a smooth transition from the deflection in one direction to the deflection in the other direction is caused.

8 Claims, 4 Drawing Figures

METHOD AND CIRCUITRY TO CONTROL THE DEFLECTION OF A PIEZOELECTRIC ELEMENT

BACKGROUND OF THE INVENTION

This invention relates to a method and associated circuitry to control the deflection of a piezoelectric element using an electrical signal supplied by means of an electrode.

Piezoelectric elements, in most cases made from ceramic materials, are frequently employed as final control elements in open and closed loop control systems. In optics they are particularly used to control the position of optical elements, e.g., the mirror of an interferometer. Here, a voltage is applied to the piezoelectric element to cause a deflection that is kept linear as closely as possible and of predetermined value. Then the voltage is reduced to reposition the piezoelectric element so that its deflection is the same as it was at the beginning of the operating cycle to prepare it for the next one.

The deflection of piezoelectric elements, however, is neither a linear nor nonlinear single-valued function of the applied voltage. On the contrary, the function exhibits the effects of hysteresis, i.e., it is double-valued. Therefore, the deflection of the piezoelectric element cannot be determined unambiguously from the supplied voltage. Specifically, the deflection also depends upon history, temperature, and aging of the piezoelectric element. For this reason conventional voltage control does not render a truly repeatable cyclic deflection of piezoelectric elements.

The shortcoming is more serious the more one realizes that, particularly for optical applications, the deflection of a piezoelectric element must have an accuracy for $\Delta L/L$ that is on the order of $10^{-8}$.

SUMMARY OF THE INVENTION

An object of this invention is to control the deflection of a piezoelectric element with high accuracy, unambiguously, and in a technically simple manner by way of an electrical signal.

The preferred embodiment of the present invention solves this problem by controlling the rate of the increase or decrease of the deflection, within the region in which hysteresis of the expansion vs. voltage characteristic occurs as a directly proportional function, and does so free from hysteresis with the increase or decrease of electrical charge supplied to the piezoelectric element from and determined by a controlled current source. While the deflection of piezoelectric elements as a function of supply voltage exhibits the effects of hysteresis, it was found by surprise that an unambiguous and, moreover, linear relationship exists between the deflection velocity and impressed current.

Preferably a time-linear deflection of a piezoelectric element is effected by impressing upon it a constant current. As is well known, the required circuitry for generating a constant current is relatively simple. A time-linear deflection of a piezoelectric element can also be obtained, at least approximately, by superposition of two voltages. One voltage increases linearly like a ramp while the other one could be, for instance, an exponential saturation function that compensates for the effects of hysteresis. Physically speaking this method is the same as it also adds to or subtracts from the piezoelectric element a constant current. However, impressing a constant current is considerably simpler and more accurate than the generation of a nonlinear voltage function to compensate for the effect of hysteresis.

A further embodiment of this invention can be provided by adding or removing a definite and predetermined amount of electrical charge to cause a predetermined increase or decrease in deflection of the piezoelectric element.

When deflecting the piezoelectric element in cycles it is important that the element is repositioned precisely to its starting position after each ramp section, the latter being preferably linear. In order to deflect periodically the piezoelectric element, using ramp sections with repositioning intervals in between, one embodiment provides for the withdrawal of the same amount of electrical charges from the piezoelectric element during repositioning by the time a new ramp section begins as was supplied to the piezoelectric element during the preceding ramp section. Repositioning then occurs to exactly the same degree of expansion that the element had at the beginning of the cycle. Here again the knowledge of the existence of an unambiguous relationship between the deflection of a piezoelectric element and the number of stored electrical charges is used.

To avoid shock loads and mechanically caused parasitic voltages of high frequencies, respectively, the latter leading to undesirable harmonic oscillations, one may expediently provide for a steadily changing current that repositions the deflection of the piezoelectric element at the end of the ramp section and that causes a discharge of the piezoelectric element without a sudden change in deflection, changing smoothly to a value required for the next ramp section. Because the deflection of the piezoelectric element is proportional to the time-integrated current, a steady current causes the deflection vs. time behavior to be "smooth," that is, a differentiable function.

When repositioning the deflection of the piezoelectric element in this manner one generates, in contrast to a jerking repositioning, only a small number of parasitic harmonics if the piezoelectric element is controlled by a triangularly shaped current between two successive ramp sections. Because of the integrating action of the piezoelectric element, such a current results in two differentiable parabolic arcs that can be connected with each other as well as with the adjacent ramp sections.

With a slightly increased amount of circuitry one can attain generation of only one single mechanical frequency during repositioning of the piezoelectric element. This can be done in accordance with another embodiment of this invention by letting the current that causes the repositioning of the deflection of the piezoelectric element between two ramp sections assume a cosine function.

The measures described above for the repositioning of a piezoelectric element into its rest position represent either individually or as a whole a suitable supplement of those methods that serve the precise deflection of a piezoelectric element. They are all based on the same knowledge that a linear relationship exists between current (and not voltage) and the deflection velocity of a piezoelectric element. It should be understood, however, that the described methods for repositioning a piezoelectric element can also be implemented advantageously without those measures that control a piezoelectric element in order to provide smooth transitions.

DESCRIPTION OF THE PREFERRED EMBODIMENT

Figure 1:
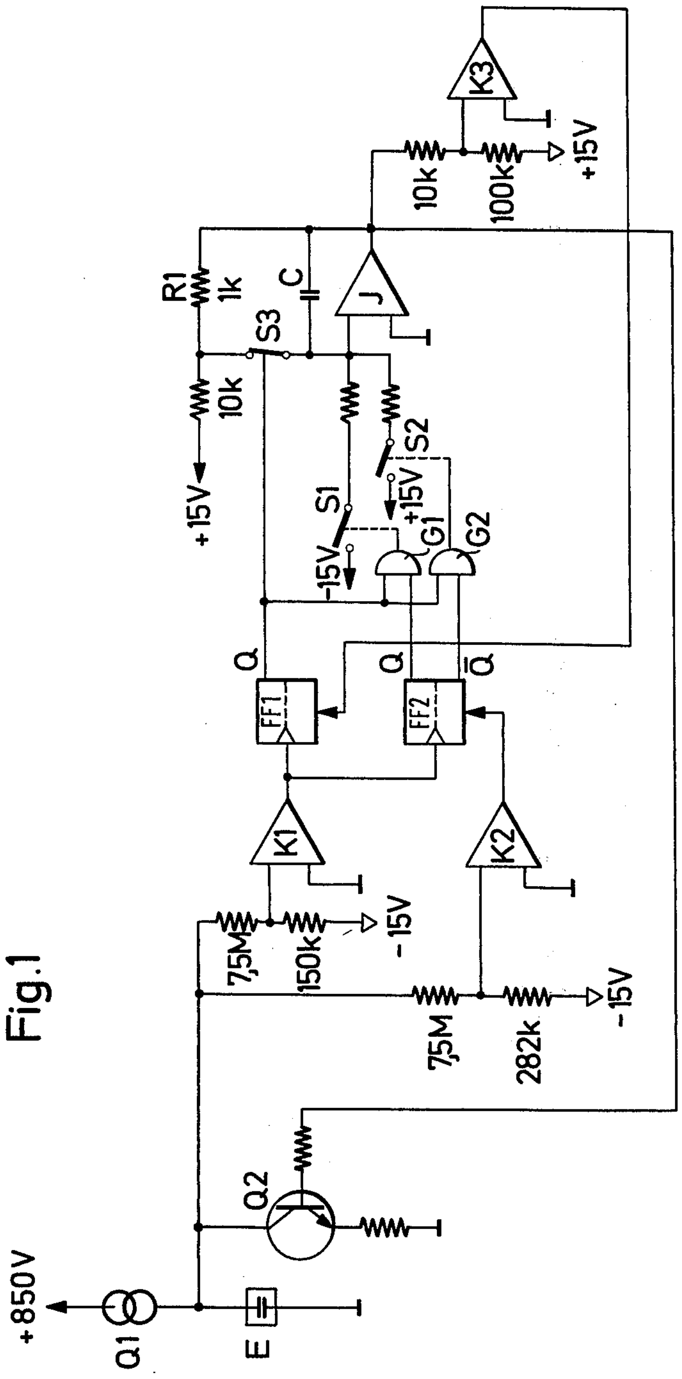
FIG. 1 is a schematic representation of a preferred embodiment of the circuitry for periodic, time-linear control of a piezoelectric element.
Figure 2:
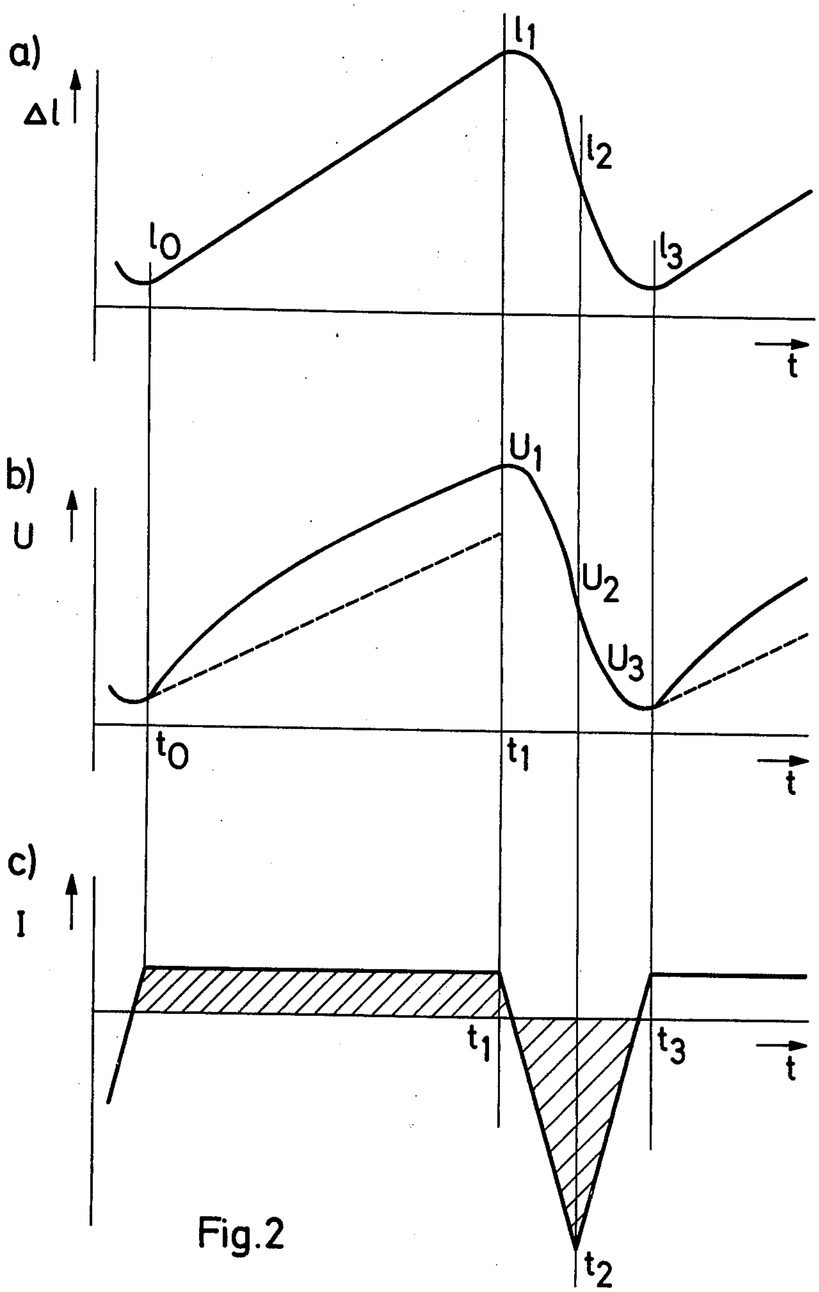
FIGS. 2*a-c* show the time characteristics of deflection, voltage, and current of the piezoelectric element controlled by the circuitry of FIG. 1.

Referring now to FIGS. 1 and 2, it is assumed that the piezoelectric element in its rest position contains an electrical charge that corresponds to the expansion LO. The piezoelectric element is to be deflected as a linear function of time within a given range, with constant slope, steadily, and periodically in accordance with FIG. 2*a*. For the circuit diagram described in the following it does not matter, however, that the piezoelectric element is always repositioned exactly to the same starting value.

Throughout the operation, current source Q1 feeds piezoelectric element E with a constant current. This causes a timelinear expansion, i.e., expansion as a linear function of time, of the piezoelectric element from value L0 at time t0 to value L1 at time t1. The voltage across the piezoelectric element during this time increases nonlinearly to potential U1 at time t1. At this moment, comparator K1 delivers setting signals to two flip-flops FF1 and FF2, so that their outputs Q have a positive logic level. Output Q of flip-flop FF1 opens electronic switch S3. For simplicity, this switch is shown only schematically. With switch S3 open the only element in the feedback of an amplifier J is capacitor C. The amplifier thus becomes an integrator.

The respective outputs Q of flip-flops FF1 and FF2 are connected to the inputs of AND-gate G1 and, therefore, signals on these outputs cause it to change state. The output of gate G1 causes electronic switch S1, shown only schematically for reasons of simplicity, to close. Switch S1 connects the input of the integrating amplifier J with voltage source −15V. Integrating amplifier J thus generates at its output a positive and linearly increasing voltage that is connected with the base electrode of a transistor. This transistor is configured to be variable current source Q2.

Current source Q2 supplies a linearly increasing current to the piezoelectric element. This current is of opposite sign to the current from current source Q1. The electrical charge on the piezoelectric element will have dropped to about half at time t2. At this time the voltage across the piezoelectric element has fallen to value U2. This voltage causes comparator K2 to change state, generating a reset signal for flip-flop FF2. FF2 output Q now shows a negative logic level. AND-gate G1 cuts off; switch S1 opens. Input potential −15V becomes disconnected from integrating amplifier J. Also complementary output Q of flip-flop FF2 and output Q of flip-flop FF1 cause AND-gate G2 to change state. Electronic switch S2, for simplicity shown schematically, connects the input of integrating amplifier J now with a voltage source of +15V. Integrating amplifier J, therefore, generates a linearly decreasing voltage applied to the base of variable current source O2. This causes the net current through the piezoelectric element to first decrease linearly to zero from a high negative value and then to increase again linearly to a positive value at time t3. At this moment, the voltage across the output of integrating amplifier J reaches the initial value U3 that it had at the beginning of the cycle. This voltage level causes comparator K3 to change its output to the opposite state, thereby generating a reset signal for flip-flop FF1. Flip-flop FF1 resets. Switch S3 is caused to close again so that resistor R1 shunts capacitor C. Thus, the amplifier keeps variable current source Q2 at cutoff so that constant current source Q1 effects again a linear deflection of the piezoelectric element. Thus a new cycle starts.

The above described circuitry achieves two significant advantages in particular over known circuit arrangements: The piezoelectric element is deflected strictly linear within the region of interest. This is because the piezoelectric element is an analog to a capacitor, having an expansion directly proportional to the time-integral of the impressed constant current. In contrast, present day technology has attempted to effect the deflection of a piezoelectric element by way of a voltage sawtooth function. Because the deflection vs. voltage characteristic of a piezoelectric element is affected by hysteresis, no linear relationship exists between voltage and deflection. It is, however, possible to superimpose on the sawtooth voltage another voltage such that the combined effects of hysteresis and expansion vs. voltage characteristic result in a time-linear deflection of the piezoelectric element. It was found with surprise that such a composite voltage characteristic leads to a constant current. Although both cases lead to a linear deflection of the piezoelectric element, a constant current source can be implemented considerably easier than the superposition of voltages to avoid the effects of hysteresis. Approximate compensation of hysteresis effects requires a time-linear increasing voltage ramp function with a superimposed auxiliary voltage that corresponds to an exponential saturation function.

Finally, discontinuities at the end of a ramp section and at the beginning of the next ramp section that cause shocklike mechanical loads of the piezoelectric element are avoided. These discontinuities would generate parasitic harmonics of high frequencies. As was found by surprise, the deflection of the piezoelectric element is directly related to the time-integral of the current. A smooth behavior of the impressed current for deflection and repositioning will therefore give a differentiable function for the expansion-time characteristic. In the example shown the repositioning current is shaped triangularly. Due to the integrating action of the piezoelectric element, the voltage across the piezoelectric element during repositioning, apart from the nonlinearity, assumes the shape of two parabolic arcs with existing time-derivative at their junction. These parabolic arcs represent a good approximation to the ideal case in which the repositioning current is a cosine function and in which the repositioning voltage is a corresponding sine function. This means that during repositioning of the deflection only one single frequency is generated. If desired, a sinusoidal deflection of the piezoelectric element during repositioning between two successive ramp sections can be obtained. This, however, requires a slightly increased amount of circuitry.

1. A method for controlling the position and rate of deflection of a piezoelectric element having electrodes placed on opposing sides thereof comprising the steps of:

supplying charge at a constant rate to the piezoelectric element via the electrodes during a first finite period of time;

smoothly changing from supplying charge to removing charge from the piezoelectric element via the electrodes during a second period of time; and smoothly changing from removing charge to supplying charge to the piezoelectric element via the electrodes during a third period of time, whereby the amount of charge supplied to is equal to the amount of charge removed from the piezoelectric element.

2. A method for controlling the position and rate of deflection of a piezoelectric element having electrodes placed on opposing sides thereof comprising the steps of:

supplying a current having a constant value to the piezoelectric element via the electrodes during a first finite period of time;

gradually changing from supplying current to removing current from the piezoelectric element via the electrodes during a second period of time; and gradually changing from removing current from to supplying current to the piezoelectric element via the electrodes during a third period of time so that the total charge supplied to is equal to the charge removed from the piezoelectric element.

3. A method as in claim 2 wherein the rate of change of the current during each of the second and third periods of time is constant, resulting in a triangular time-current relationship.

4. A method as in claim 2 wherein the greatest value of the current removed during the second and third periods of time is greater than the constant value of the current supplied during the first period of time.

5. A method as in claim 2 wherein the rate of change of the current during each of the second and third periods of time is sinusoidal.

6. An apparatus for controlling the position and rate of deflection of a piezoelectric element having electrodes placed on opposing sides thereof, the apparatus comprising:

current supply means connected to the electrodes for supplying current to the piezoelectric element; and circuit means connected to the electrodes and the current supply means for causing the current supply means to supply current at a constant level during a first finite time interval, to supply current at a level that gradually changes from the constant level to a second level having an opposite polarity during a second time interval, and to supply current at a level that gradually changes from the second level back to the constant level during a third time interval for removing during the second and third time intervals the current supplied during the first time interval.

7. An apparatus as in claim 6 wherein:

the current supply means comprises a constant current source and a variable current source having a control input; and the circuit means comprises a first detector having an input connected to the piezoelectric element and having an output for giving an output signal when the potential on the piezoelectric element reaches a first level; a second detector having an input connected to the piezoelectric element and having an output for giving an output signal when the potential on the piezoelectric element reaches a first level; a second detector having an inpuut connected to the piezoelectric element and having an output for giving an output signal when the potential on the piezoelectric element reaches a second level; a current control circuit connected to the outputs of the first and second detectors and to the control input of the variable current source for causing the variable current source to remove an increasing amount of current from the piezoelectric element in response to an output signal from the first detector during the second time interval and for causing the variable current source to remove a decreasing amount of current in response to an output signal from the second detector during the third time interval; and a third detector connected to the current control circuit for giving an output signal to the current control circuit when the variable current source has removed as much current as the constant current source has supplied to cause the current control circuit to cause the variable current source to stop removing current from the piezoelectric element.

8. An apparatus as in claim 7 wherein:

the current control circuit includes an integrator having an input and having an output for producing the output signal to the variable current source;

the input of the integrator is connected to a first constant voltage during the second time interval; and the input of the integrator is connected to a second constant voltage having a polarity opposite that of the first constant voltage during the third time interval.

* * * * *

UNITED STATES PATENT AND TRADEMARK OFFICE

CERTIFICATE OF CORRECTION

PATENT NO. : 3,916,226

DATED : October 28, 1975

INVENTOR(S) : Dieter Bertram Knoll

It is certified that error appears in the above-identified patent and that said Letters Patent are hereby corrected as shown below:

Column 3, line 60, "output Q" (first occurrence) should read -- output $\bar{Q}$ --; line 66, "O2" should read -- Q2 --;

Column 6, line 19, "inpuut" should read -- input --.

Signed and Sealed this

*third* Day of *February 1976*

[SEAL]

*Attest:*

RUTH C. MASON
*Attesting Officer*

C. MARSHALL DANN
*Commissioner of Patents and Trademarks*